United States Patent [19]

De Jong

[11] Patent Number: 5,003,173
[45] Date of Patent: Mar. 26, 1991

[54] ELECTRON BEAM APPARATUS WITH DYNAMIC FOCUSSING

[75] Inventor: Marcus J. C. De Jong, Eindhoven, Netherlands

[73] Assignee: U.S. Philips Corporation, New York, N.Y.

[21] Appl. No.: 418,415

[22] Filed: Oct. 6, 1989

[30] Foreign Application Priority Data

Dec. 23, 1988 [NL] Netherlands .................. 8803153

[51] Int. Cl.⁵ .............................................. G21K 5/10
[52] U.S. Cl. ................................. 250/311; 250/440.1; 250/442.1; 250/310
[58] Field of Search ..................... 250/311, 442.1, 398, 250/440.1

[56] References Cited

U.S. PATENT DOCUMENTS

| | | | |
|---|---|---|---|
| 3,629,577 | 12/1971 | Weber et al. | 250/442.1 |
| 3,702,399 | 11/1972 | Lucas | 250/442.1 |
| 4,170,737 | 10/1979 | Bobrov et al. | 250/311 |
| 4,306,149 | 12/1981 | Le Poole et al. | 250/311 |
| 4,393,310 | 7/1983 | Hahn | 250/398 |
| 4,661,968 | 4/1987 | Wondergem | 250/442.1 |

Primary Examiner—Jack I. Berman
Assistant Examiner—Kiet T. Nguyen
Attorney, Agent, or Firm—Paul R. Miller

[57] ABSTRACT

Notably for transmission measurements, an electron microscope utilizes a dynamic focussing imaging optical system so that the focussing is optimally adjusted according to scanning lines even when measurements are performed on tilted objects. To this end, the object is preferably scanned in a pattern of lines extending parallel to an object tilt axis. Any defocussing of the electron beam, occurring at the irradiating side due to the dynamic focussing, can also be instantaneously corrected.

11 Claims, 1 Drawing Sheet

ELECTRON BEAM APPARATUS WITH DYNAMIC FOCUSSING

FIELD OF THE INVENTION

The invention relates to an electron beam apparatus, comprising an electron source, an electron-optical system, an object holder with an object tilting device, and a device for compensation of defocussing errors in the image due to object tilting.

DESCRIPTION OF THE RELATED ART

An apparatus of this kind is known from Eurem 1988 York, Ser. No. 93, Vol. 1, pp. 139 and 140. Therein, defocussing errors liable to occur due to object tilting are reduced by introducing compensation, taking into account the tilt angle, for each sub-zone of the subject. The errors occurring within these sub-zones are accepted.

Such a compensation method is comparatively complex when adequate definition is to be obtained and still exhibits excessive defocussing error for a reduced number of sub-zones. Furthermore, the method is subject to undesirable object edge phenomena which can be reduced only by using a comparatively large electron beam; however, in that case variations occur across the beam diameter.

Object tilting is desirable for many fields of examination in electron microscopy. Examples in this respect are, for example three-dimensional imaging, biological examinations, crystal face measurements and the like. Notably for the comparatively large tilting angles required in such applications, for example for reducing the so-called missing cone in three-dimensional imaging, inadmissible defocussing occurs in images formed by an electron beam irradiating the object. The focus variation within an image results in a location-dependent contrast transfer function which determines the image contrast as well as the image resolution. Consequently, the examination of structures and the like is seriously affected, notably in the case of imaging with a low dose and a small enlargement factor where comparatively large object surfaces are irradiated. Similar problems occur in high-resolution microscopy with three-dimensional imaging. The variation in focus is directly given by the local height variation of the object with respect to a focal plane, and hence directly by the beam position with respect to the optical axis or a tilt axis of the object and the tilt angle of the object.

SUMMARY OF THE INVENTION

Utilizing the circumstances, it is an object of the invention to provide a comparatively simple but exact focus compensation; to achieve this, an electron beam apparatus of the kind set forth in accordance with the invention is characterized in that the electron-optical system comprises a beam scanning device for scanning an object in a line pattern, adapted to an object tilt line, and also comprises a dynamic focussing device which is controllable in dependence of the tilt angle and the distance between the scanning beam and the tilt line.

Because focussing is adapted per scanning line in accordance with the invention, which line preferably extends parallel to the tilt line, optimum focussing can be simply realized across a comparatively large image surface. The correction data per scanning line are geometrically determined so that they can be readily converted into correction signals. The degree of focussing compensation and the resolution are adjustable by selection of the scanning pattern, i.e. the number of scanning lines and their spacing. Such scanning facilities are usually already included in known electron microscopes, so that the use of the invention requires hardly any additional facilities.

For the scanning of focus-corrected straight scanning lines extending parallel to the tilt axis, the assumption of the customary situation is that the focal plane in the apparatus coincides with a flat plane through the tilt line transversely of the optical axis. When the electron-optical system has a focal plane which is, for example spherically curved, compensation can be performed by scanning along semi-circular/semi-elliptical paths with the tilt axis and the axis of the ellipse, respectively, serving as the central line. Thus, focussing errors occurring in the apparatus can also be compensated for.

A preferred embodiment of the electron beam apparatus is suitable for transmission measurements, focussing being performed line-wise so that focussing is always locally optimum in images made with a beam passing through the object, a detector being suitable for the detection of transmission signals.

Integral optimum imaging of the specimen is thus realized by instantaneous focussing of the image per scanning line. customarily, focussing will always take place at the level of the irradiated object part, which object part is then instantaneously displayed on the detector. If out-of-focus measurement is desirable, the object focal point can also be selected so as to be situated in a different position, resulting in a non-optimally focussed image as desired for some examinations.

The invention can be used notably for examinations where a comparatively large object is irradiated. because in that case comparatively severe defocussing would occur. The need for the analysis of large objects may be imposed by the nature thereof, but it may also be advantageous to work with a comparatively large object in order to keep the local load of the object below a maximum permissible limit, i.e. to work with a comparatively large spot. The comparatively small enlargement that required can be neutralized, if desired. by post-enlargement of the image carrier.

In a preferred embodiment, the electron beam apparatus comprises a digital control device and a signal processing device enabling exact central control of dynamic focussing. If desired, control parameters can be readily stored in a memory.

BRIEF DESCRIPTION OF THE DRAWING

Some preferred embodiments in accordance with the invention will be described in detail hereinafter with reference to the drawing. In the drawing.

DESCRIPTION OF THE INVENTION

Figure 1:
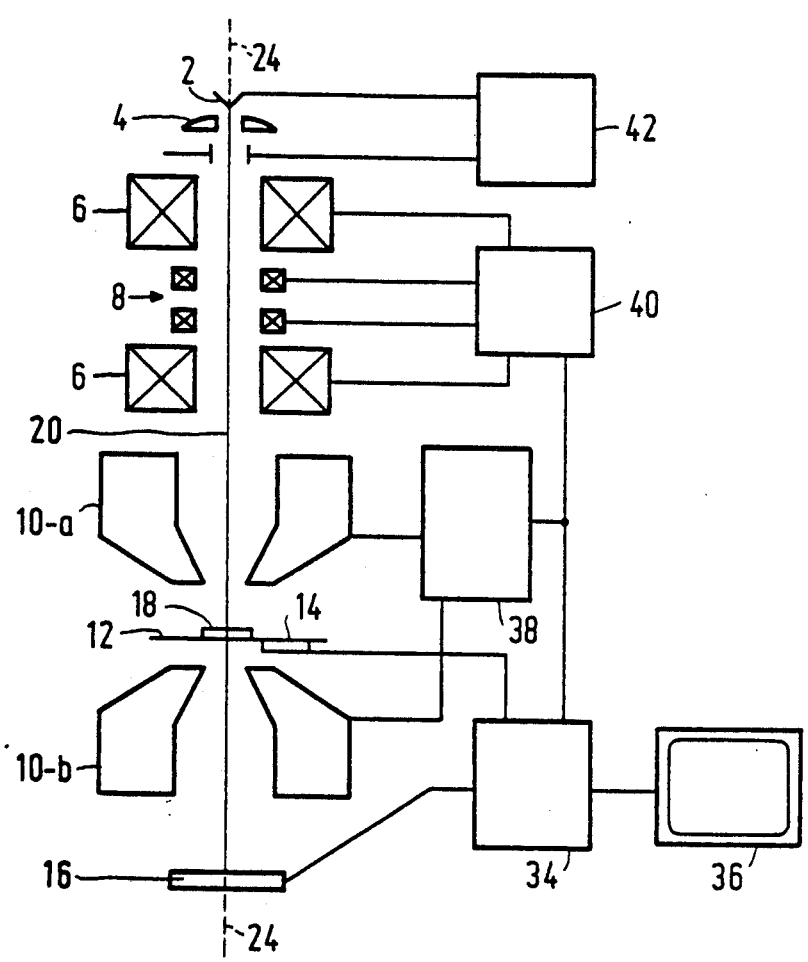
FIG. 1 diagrammatically shows an electron beam apparatus in accordance with the invention.
Figure 2:
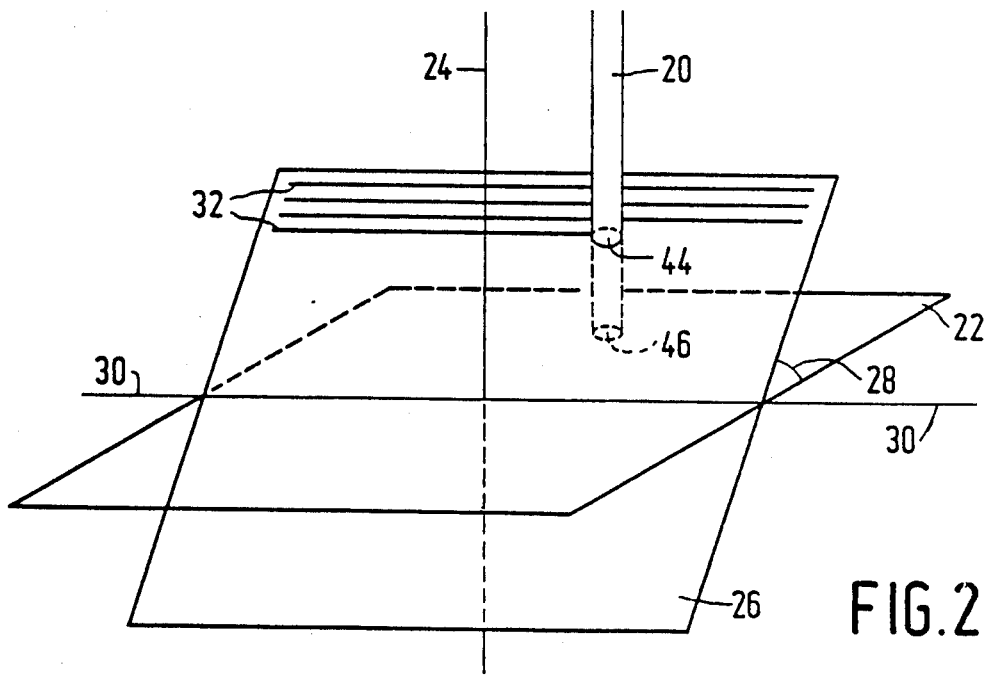
FIG. 2 shows a tilt situation for an object to be examined thereby.

An electron microscope as shown in FIG. 1 is described in detail in, for example "Philips Technical Review", Vol 43, No. 10, November 1987, pp. 273-291, and comprises an electron source 2, an anode 4 and a condensor system 6, a beam-scanning device 8, an objective lens system 10, an object holder 12 with an object tilting device 14 and a detector 16 for measuring an electron beam 20 which irradiates an object 18 arranged on the object holder. When the object to be examined is placed in a tilted position in such an apparatus, for example as shown in FIG. 2, in a plane 26 which encloses a tilt angle 28 with respect to a focal plane 22, the electron beam 20 will be focussed only on a tilt line 30 when the focal plane 22 coincides with a plane transversely of main axis 24 of the apparatus. Using the beam scanning device 8, which may also be arranged elsewhere in the apparatus, the object is line-wise scanned along (in this case) straight scanning lines 32 which extend parallel to the tilt axis 30.

By readjusting the focussing for each scanning line in accordance with the invention, across the entire zone to be examined imaging will take place, even in the case of a tilted object, with an imaging optical system which is optimally focussed for the target of the scanning electron beam, because the optical system is instantaneously focussed for the relevant position of the irradiated object sub-region, so that scanning takes place with an optimally focussed beam at that area. To this end, a tilt angle sensor of the tilting device is connected to a central measuring and control device 34 whereto the detector 16 is also connected. A monitor 36 for display may be connected to the device 34. The central control device 34 is also coupled to a lens adjusting unit 38 for activating the refocussing and to a beam deflection control device 40 for synchronizing the focussing with the scanning position of the beam. In a lens as described in U.S. Pat. No. 4,306,149, this can be realized, for example by instantaneous readjustment of the energizing of the first pole-lens 10-a of the objective lens. The beam geometry, for example the transverse dimension and the angle of aperture can thus also be adjusted for adaptation to instantaneously desired beam parameters. For beam current control, for example beam blanking, the control device may also be connected to a source control device 42 for the exposure system of the apparatus which comprises, for example a beam blanker for beam blanking. For different methods of examination and the associated beam paths, reference is made to the cited article in "Philips Technical Review". By choosing the ratio of the spot dimension to the spacing of the scanning lines, either a pattern of separate lines, a pattern of touching lines or a pattern of overlapping lines is formed. A strongly overlapping line pattern may be attractive, for example when a comparatively large spot is used with, for example non-negligibly small defocussing within the transverse dimension of the beam. By irradiating and detecting each object element a number of times, a kind of mean focussing situation can then be assumed, which situation may be considered to be the same for each pixel. As a result, reconstruction is simplified and image artefacts can be avoided without giving rise to the discontinuities inherently occurring in the known method. If the focussing of a position 46 in the focal plane 22 is shifted to a position 44 in the tilted plane 26 due to refocussing of the imaging optical system, i.e. in this case by the second pole-lens 10-b, defocussing is liable to occur in the scanning electon beam 20. Because the effect of the second pole-lens on the beam geometry is known or can be measured, in which case it is fixed, correction can also be realized for this phenomenon, for example by readjustment of the first lens-pole 10-a or the condensor system.

I claim:

1. An electron beam apparatus comprising
   (a) electron source means for providing an electron beam,
   (b) electron optical means for controlling said electron beam, said electron optical means including scanning means for scanning said electron beam,
   (c) holder means for holding an object in said electron beam, said holder means including object tilting means for tilting said object in a tilt plane about a tilt axis disposed in a focussing plane,
   said scanning means scanning said electron beam as a scanning line over said object in a line pattern,
   (d) image focussing means for dynamically correcting focus of said electron beam to said tilt plane according to a tilt angle of said tilt plane and a distance between the scanning line and said tilt axis, and
   (e) detection means for detecting irradiation of said object by said scanning electron beam.

2. An electron beam apparatus according to claim 1, wherein said source means and said electron optical means generated a coherent electron beam for scanning said object.

3. an electron beam apparatus according to claim 2, wherein said scanning means scans said electron beam over said pattern in a rectangular line pattern, and wherein the scanned lines are parallel to said tilt axis.

4. An electron beam apparatus according to claim 2, wherein said scanning means scans said electron beam over said pattern in semi-circular or elliptical lines, and wherein a central line of said pattern coincides with said tilt axis.

5. An electron beam apparatus according to claim 1, wherein said detection means reconstructs three-dimensional images from signals of said object detected at different angles of tilt.

6. an electron beam apparatus according to claim 1, wherein said scanning means scans said electron beam over said object in overlapping lines, and wherein said detection means measures a plurality of signals from said object to average out focussing differences in image reconstruction.

7. An electron beam apparatus according to claim 1, wherein said image focussing means includes means for refocussing the irradiating electron beam upon defocussing because of dynamic focussing at an irradiated area of said object.

8. An electron beam apparatus according to claim 1, wherein said electron optical means includes beam blanking means for blanking said electron beam according to said scanning of said electron beam over said object.

9. An electron beam apparatus according to claim 1 further comprising digital control means for controlling said holder means, said image focussing means, said detection means, and said electron optical means.

10. An electron beam apparatus according to claim 1, wherein said scanning means scans said electron beam over said pattern in a rectangular line pattern, and wherein the scanned lines are parallel to said tilt axis.

11. An electron beam apparatus according to claim 1, wherein said scanning means scans said electron beam over said pattern in semi-circular or elliptical lines, and wherein a central line of said pattern coincides with said tilt axis.

* * * * *